United States Patent
Horten et al.

(10) Patent No.: US 8,279,614 B2
(45) Date of Patent: Oct. 2, 2012

(54) MODEM, IN PARTICULAR FOR SUBSEA POWER LINE COMMUNICATION

(75) Inventors: Vegard Horten, Rasta (NO); Vidar Steigen, Nittedal (NO)

(73) Assignee: Siemens Aktiengesellschaft, Munich (DE)

( * ) Notice: Subject to any disclaimer, the term of this patent is extended or adjusted under 35 U.S.C. 154(b) by 514 days.

(21) Appl. No.: 12/374,694

(22) PCT Filed: Jul. 24, 2006

(86) PCT No.: PCT/EP2006/007269
§ 371 (c)(1),
(2), (4) Date: Feb. 2, 2009

(87) PCT Pub. No.: WO2008/011890
PCT Pub. Date: Jan. 31, 2008

(65) Prior Publication Data
US 2009/0310317 A1    Dec. 17, 2009

(51) Int. Cl.
H05K 5/00 (2006.01)
H05K 1/18 (2006.01)
H05K 7/14 (2006.01)
H05K 1/00 (2006.01)
H05K 1/16 (2006.01)
H05K 1/09 (2006.01)
H05K 1/11 (2006.01)

(52) U.S. Cl. ........ 361/752; 361/748; 361/753; 361/757; 361/761; 361/796; 174/250; 174/260; 174/256; 174/263

(58) Field of Classification Search .......... 174/250–268; 361/736–812
See application file for complete search history.

(56) References Cited

U.S. PATENT DOCUMENTS

| 5,010,529 A | 4/1991 | Maynus ................. 367/137 |
| 5,724,234 A * | 3/1998 | Phelps .................. 361/816 |
| 5,883,791 A * | 3/1999 | Deguchi ................ 361/818 |
| 6,556,450 B1 * | 4/2003 | Rasmussen et al. ....... 361/754 |
| 7,259,969 B2 * | 8/2007 | Zarganis et al. .......... 361/800 |
| 2004/0248436 A1 * | 12/2004 | Abe et al. ............. 439/76.1 |
| 2005/0243893 A1 | 11/2005 | Causier ................ 379/93.01 |
| 2006/0139833 A1 | 6/2006 | Ranta et al. ........... 361/113 |
| 2008/0010488 A1 | 1/2008 | Riggsby ................. 375/1 |
| 2009/0097581 A1 | 4/2009 | McCallister et al. ......... 6/9 |

FOREIGN PATENT DOCUMENTS

| CN | 1251957 A | 5/2000 |
| EP | 0975097 A2 | 7/1999 |
| GB | 2355167 A | 4/2001 |
| GB | 2355595 A | 4/2001 |
| GB | 2352376 B | 4/2004 |
| RU | 2178951 C1 | 1/2002 |

(Continued)

OTHER PUBLICATIONS

PCT International Search Report and Written Opinion, PCT/EP2006/007269, 10 pages, Jun. 27, 2007.

(Continued)

Primary Examiner — Jayprakash N Gandhi
Assistant Examiner — Jerry Wu
(74) Attorney, Agent, or Firm — King & Spalding L.L.P.

(57) ABSTRACT

A modem, in particular for subsea power line communication, has electronic components on a circuit board, and a metal encapsulation, wherein the encapsulation forms at least two chambers separated by at least one wall, wherein each of the chambers surrounds at least one of the electronic components.

16 Claims, 4 Drawing Sheets

FOREIGN PATENT DOCUMENTS

| | | |
|---|---|---|
| RU | 2269869 C2 | 2/2006 |
| WO | 9712505 | 4/1997 |
| WO | 2008/011889 A1 | 1/2008 |
| WO | 2008/011891 A1 | 1/2008 |

OTHER PUBLICATIONS

PCT Notification of Transmittal of the International Preliminary Report on Patentability, PCT/EP2006/007268, 9 pages, Nov. 4, 2008.

PCT International Search Report and Written Opinion, PCT/EP2006/007268, 9 pages, Sep. 14, 2006.

PCT International Search Report and Written Opinion, PCT/EP2006/007270, 9 pages, Apr. 11, 2007.

PCT Notification of Transmittal of the International Preliminary Report on Patentability, PCT/EP2006/007270, 6 pages, Nov. 3, 2008.

* cited by examiner

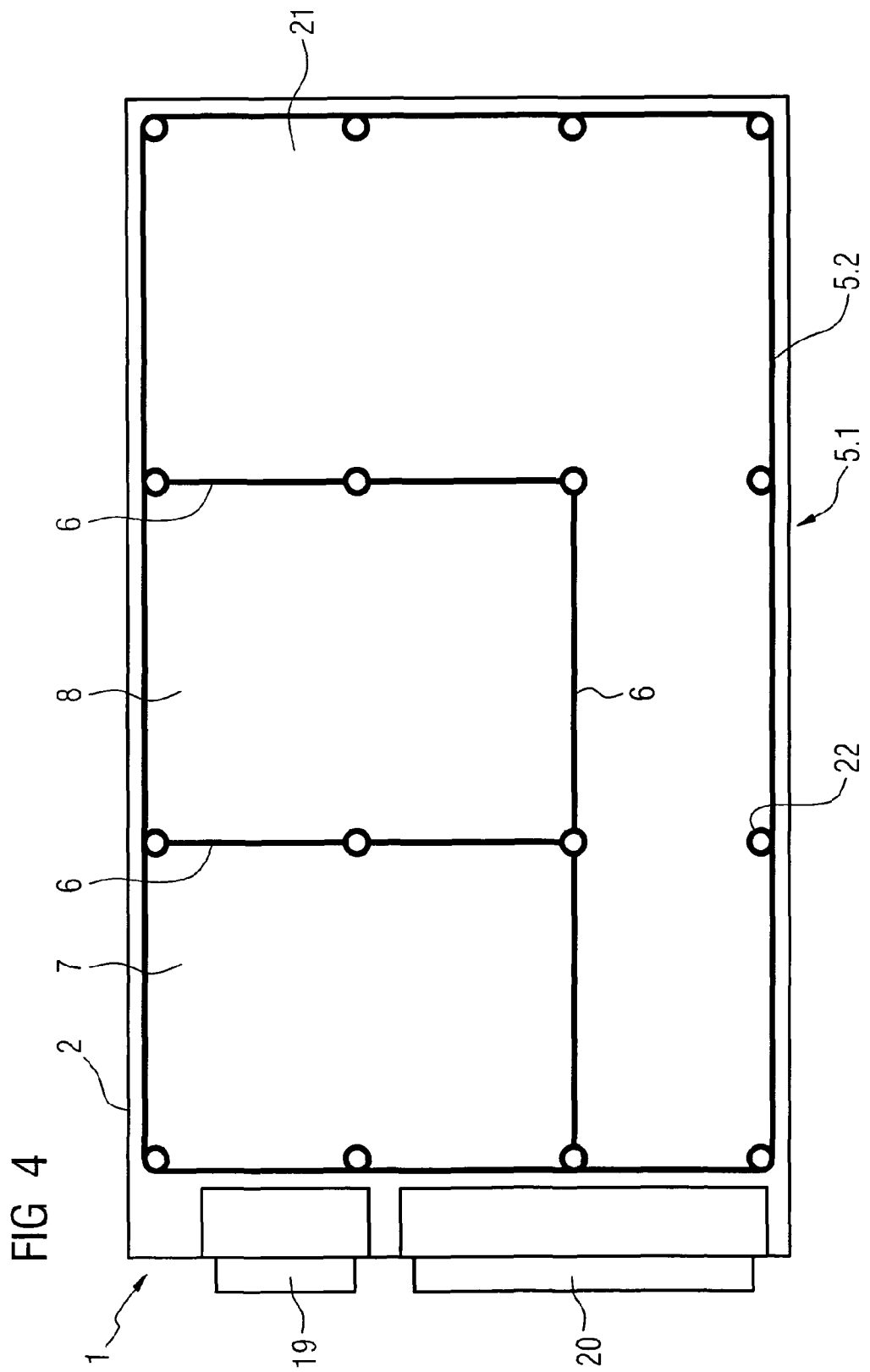

MODEM, IN PARTICULAR FOR SUBSEA POWER LINE COMMUNICATION

CROSS-REFERENCE TO RELATED APPLICATIONS

This application is a U.S. National Stage Application of International Application No. PCT/EP2006/007269 filed Jul. 24, 2006, which designates the United States of America. The contents of which are hereby incorporated by reference in their entirety.

TECHNICAL FIELD

The invention relates to a modem, in particular for subsea power line communication, comprising electronic components on a circuit board, and a metal encapsulation.

BACKGROUND

Subsea power line communication is a special form of underwater communication. It is preferably used in exploring and exploiting gas and oil fields located at the seabed. Subsea communication is used, for example, for transmitting various data between topside control sites and subsea wellheads. Gas and oil fields that are explored or exploited using electronic communication to the wellheads or to other electronic equipment are sometimes called "electronic fields" (e-fields).

In prior art, different techniques for subsea communication have been described. On the one hand, there are wired electric or optical connections, on the other hand there are wireless connections. The wired connections can be subdivided into a first group providing communication lines for electronic or optical connections separate from electric power lines, and a second group utilising power lines for electronic communications. In the latter case, advantageously no separate communication lines are needed.

For example, in US 2005/0243983 A1, a modem for receiving and transmitting data from and to a conductor is described. It comprises an output drive for transmitting data to the conductor, a receiver for receiving data from the conductor and impedance matching means for matching an impedance of a receiver input with an impedance of the conductor. A gain of the output drive, a receiver gain and the impedance of the receiver input are adjustable at this modem.

Modems typically use a printed circuit board (PCB) onto which electronic components such as integrated circuits (IC) are mounted. These components usually are sensitive to electro-magnetic radiation, in particular to radiation in the radio frequency (RF) range, resulting in electronic interference and noise. As a consequence, the bit rate and the operational range of a modem connection are affected by the extent of radiation its electronic components are exposed to. The negative impact of radiation is even increased as the tracks connecting the electronic components act as receiving aerials. Therefore, the electronic components and the printed circuit board are sought to be shielded against radiation.

The known modems for subsea power line communication use a metal box that entirely surrounds their printed circuit board to shield the electronic components and the tracks between them from external radio frequency radiation. However, the possible bit rate and the possible operational range of these modems is limited because of the limited shielding properties of the metal box encapsulation.

SUMMARY

According to various embodiments, a modem can be specified having improved shielding properties, thereby significantly reducing electronic interference and/or noise.

According to an embodiment, a modem, in particular for subsea power line communication, may comprise electronic components on a circuit board, and a metal encapsulation, characterised in that the encapsulation forms at least two chambers separated by at least one wall, wherein each of the chambers surrounds at least one of the electronic components.

According to a further embodiment, the chambers can be arranged at a first side of the circuit board. According to a further embodiment, at least one of the chambers may be continued at a second side of the circuit board. According to a further embodiment, the circuit board may subdivide the continued chamber into two parts. According to a further embodiment, at least the separating wall may be in tight contact with the circuit board. According to a further embodiment, the circuit board may be provided at its surface with at least one metal contact zone for at least the separating wall. According to a further embodiment, the encapsulation may comprise a front cover, a one-piece front frame for the first side of the circuit board, a one-piece back frame for the second side of the circuit board, and a back cover. According to a further embodiment, one plane side of each of the frames may be entirely in tight contact with the circuit board. According to a further embodiment, the encapsulation may comprise a metal body surrounding a power amplifier component. According to a further embodiment, the modem may comprise at least three chambers, wherein the first chamber surrounds analogue send and receive components, and the second chamber surrounds analogue-to-digital and digital-to-analogue components, and the third chamber surrounds a high-frequency digital signal processor, a field programmable gate array and a DC/DC power supply. According to a further embodiment, the encapsulation may consist of aluminum. According to a further embodiment, the encapsulation may have a least thickness of 2 mm.

BRIEF DESCRIPTION OF THE DRAWINGS

In the following, the invention is described in further detail with several drawings.

FIG. 4 shows a schematic back view of the subsea power line modem.

In all drawings, corresponding parts are denoted by identical reference signs.

DETAILED DESCRIPTION

Figure 1:
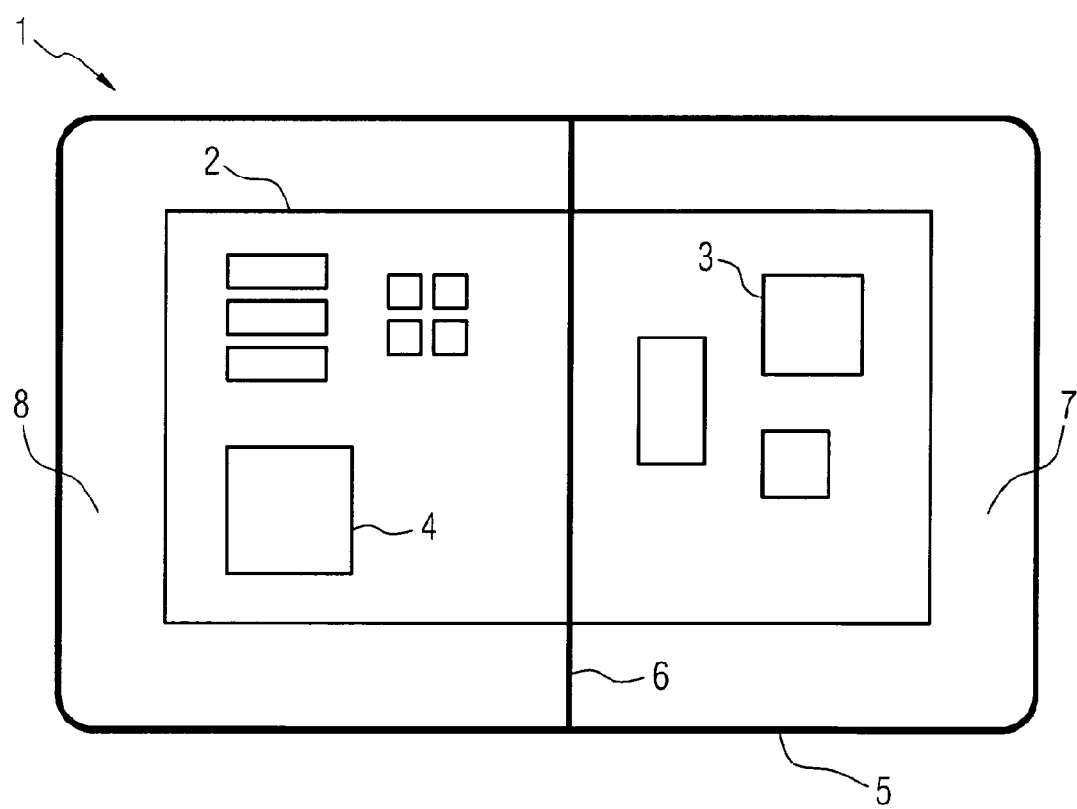
FIG. 1 shows a schematic front view of a generic modem with a basic encapsulation.

According to various embodiments, it is proposed that the encapsulation forms at least two chambers separated by at least one wall, wherein each of the chambers surrounds at least one of the electronic components. By this solution, the wall separating the chambers also separates the electronic components contained in the different chambers, thus providing improved shielding properties. Some of the electronic components themselves emit RF radiation affecting the others, resulting in electronic interference and noise as stated out above. This effect is significant in particular for modems using orthogonal frequency division multiplexing (OFDM). The proposed encapsulation not only shields the electronic components from external RF radiation, but also from each other, i.e., from internal RF radiation. As a consequence, the connection bit rate and operational range of the modem according to various embodiments are significantly increased in relation to prior art.

In an embodiment, the chambers are arranged at a first side of the circuit board. This provides a simple construction of the encapsulation and thus of the modem.

In another embodiment, at least one of the chambers is continued at a second side of the circuit board. This implies that the separating wall is also continued at the second side, and that the circuit board subdivides the continued chamber into two parts. Thereby, the chamber entirely surrounds the at least one respective electronic component in the manner of a Faraday cage.

This improves the shielding properties against RF radiation. Besides, the encapsulation and the modem can be constructed compactly as the printed circuit board is supported from two sides.

An optimal shielding is achieved with an embodiment, wherein at least the separating wall is in tight contact with the circuit board. Depending on the actual frequency of emitted radiation, the quality of the shielding degrades with the size of holes or gaps in the encapsulation. A strong shielding is achieved by a tight contact of the separating wall or even the whole encapsulation with the circuit board.

For an optimal shielding, the circuit board is provided at its surface with at least one metal contact zone for at least the separating wall. The board may have conducting tracks in its inner layers in parallel to the zones and contacted with them to even improve the shielding. This way, even the circuit board itself contributes to improve the shielding properties.

In an embodiment, the encapsulation comprises a front cover, a one-piece front frame for the first side of the circuit board, a one-piece back frame for the second side of the circuit board, and a back cover. This kind of encapsulation is stable, easy to produce and easy to handle when mounting it to the circuit board. Besides, it provides a high-quality Faraday cage.

Advantageously, one plane side of each of the frames is entirely in tight contact with the circuit board. This allows for a stable and compact construction of the modem as the encapsulation acts as reinforcement to the circuit board.

In another embodiment, the encapsulation comprises a metal body surrounding a power amplifier (PA) component. Power amplifiers emit large amounts of waste heat. By the metal body surrounding the power amplified, the power amplifier can be both cooled and additionally shielded. The metal body guides the waste heat to the outer surfaces of the encapsulation. In addition to the metal body which has no electrical contact to the power amplifier, the power amplifier may be directly connected with the outer encapsulation by a heat sink or a heat pipe that not touches the metal body. The heat pipe is galvanically insulated from the outer encapsulation.

Another embodiment comprises at least three chambers, wherein the first chamber surrounds analogue send and receive components, and the second chamber surrounds analogue-to-digital components and digital-to-analogue components, and the third chamber surrounds a high-frequency digital signal processor, a field programmable gate array and a DC/DC power supply. In this embodiment, a minimum electronic interference is achieved by strictly separating the most critical components.

Advantageously, the encapsulation consists of aluminum. This material is lightweight and conductive. Thus, it provides a high-quality Faraday cage at a low total weight of the modem.

For strong shielding properties and high stability of the encapsulation, the encapsulation preferably has a least thickness of 2 mm.

FIG. 1 explains the principle of the various embodiments. It schematically shows a modem 1, comprising a printed circuit board 2 equipped with a high-frequency digital signal processor 3(DSP) and a power amplifier 4. Both electronic components are sensitive to electromagnetic RF radiation, but massively emit electromagnetic radiation themselves. A metal encapsulation 5, whose surface is opened in the figure, entirely surrounds the printed circuit board 2. The encapsulation 5 consists of two mirrored shells (not visible in the figure). Both shells comprise a respective bar, which, if the shells are assembled as shown, establish a wall 6. The wall 6 is continuous apart from a through hole (not visible) for the printed circuit board 2. Thus, the encapsulation 5, if assembled around the printed circuit board 2, forms a first chamber 7 and a second chamber 8 which are separated by the wall 6. Each chamber 7, 8 surrounds both the front side and the back side of the printed circuit board 2. The printed circuit board 2 is fixed between the shells by columns (not shown) that are part of the encapsulation 5 shells, and by the bars.

The encapsulation 5 comprising the wall 6 acts as a Faraday cage, electromagnetically shielding the digital signal processor 3 in the first chamber 7 from the radiation emitted by the power amplifier 4 in the second chamber 8 and vice versa. Besides, the encapsulation 5 shields both the digital signal processor 3 and the power amplifier 4 from external electromagnetic radiation. Hence, the risk of electronic interference and the noise in these electronic components are significantly reduced.

Figure 2:
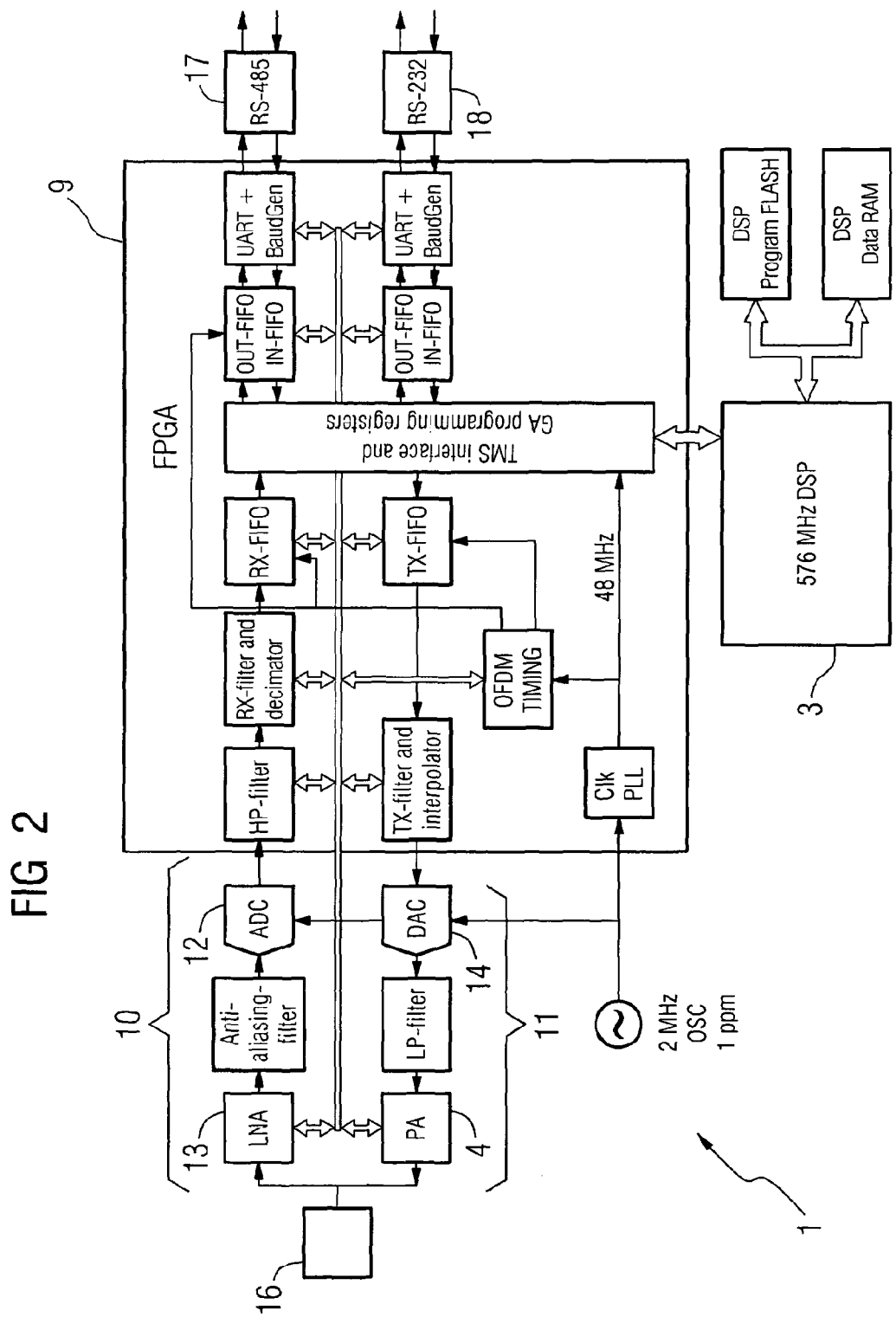
FIG. 2 shows a block diagram of a subsea power line modem.

In FIG. 2, a block diagram of a subsea power line modem is shown. The modem 1 comprises a field programmable gate array 9 (FPGA), a digital signal processor 3, an analogue-to-digital processing line 10 and a digital-to-analogue processing line 11. An analogue-to-digital converter 12 (ADC) and a low-noise amplifier 13 (LNA) are part of the analogue-to-digital processing line 10. A digital-to-analogue converter 14 (DAC) and a power amplifier 4 are part of the digital-to-analogue processing line 11. Both processing lines 10 and 11 are connected with a diplexer 16 via a differential interface (not shown). By the diplexer 16, the modem is connectable to the subsea power line (not shown). The field programmable gate array 9 provides two independent bidirectional external serial interfaces, one RS-485 connection 17 connectable with a so-called PROFIBUS for binary payload data, and one RS-232 connection 18 for diagnostic data. The components are mounted on both sides of a single six-layer printed circuit board (not shown in this figure).

On the one hand, the field programmable gate array 9 creates an OFDM-modulated signal from the binary data obtained from the RS-485 connection 17 and, if required, from diagnostic data obtained from the RS-232 connection 18. These data are modulated onto the electric signal of the power line. On the other hand, the field programmable gate array 9 demodulates an OFDM-modulates signal obtained from the power line via the diplexer 16 into binary payload data, and, if necessary, into diagnostic data that are output to the RS-485 connection 17 and the RS-232 connection 18, respectively. As computation costs are high for OFDM the field programmable gate array 9 utilizes the digital signal processor 3 for both modulation and demodulation. The diplexer 16 is able to connect the RF modem 1 to both ends of a power line cable in such way that two modems 1 are able to communicate with each other while the cable is also used for power distribution.

With OFDM, which itself is known from television broadcasting, the transmitting modem sends on multiple different orthogonal frequencies called carrier bands or channels. Two carrier bands are said to be orthogonal if they are independent from each other regarding their relative phase relationship. The binary data is modulated onto the electric signal in the form of so-called OFDM symbols.

Figure 3:
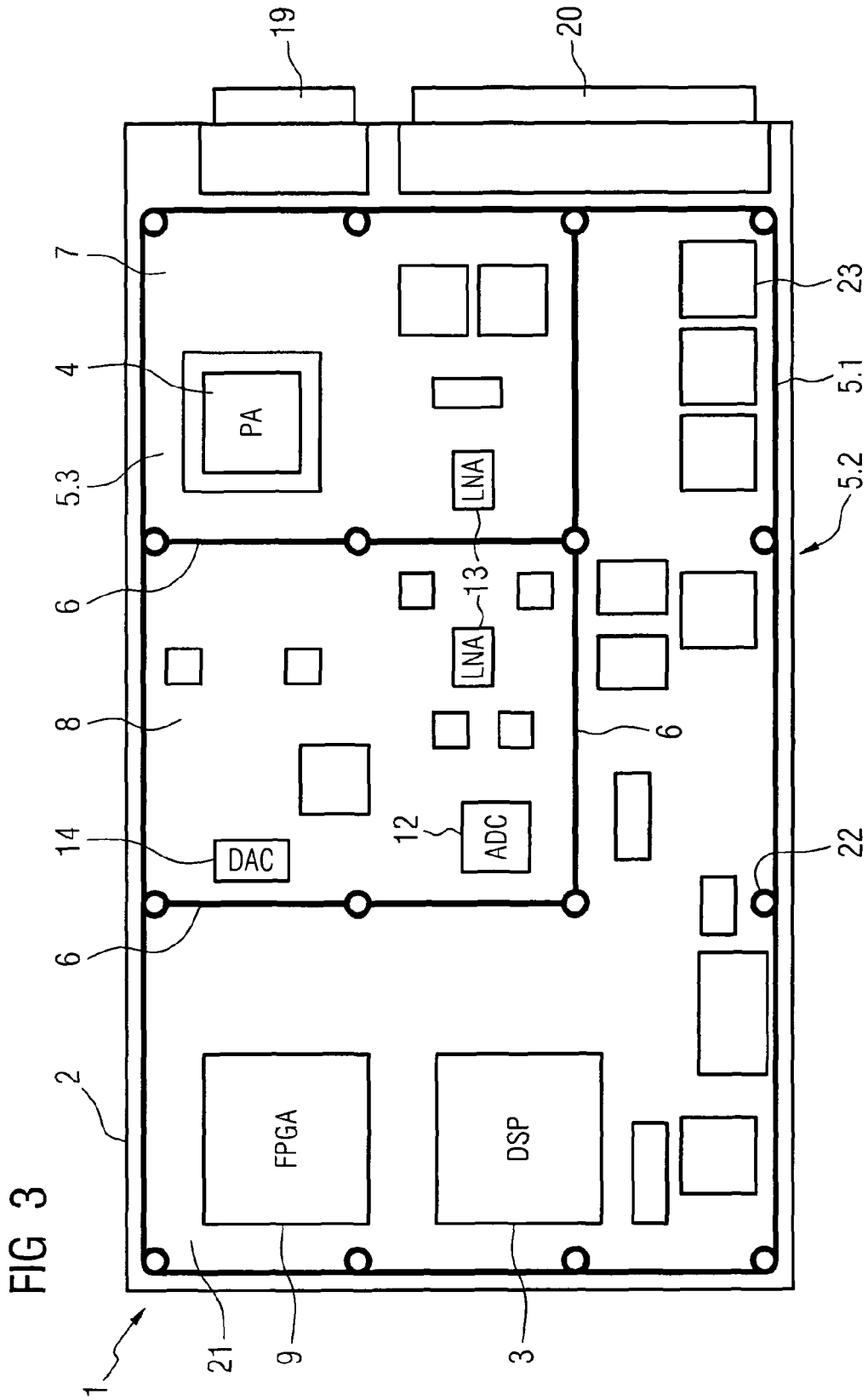
FIG. 3 shows a schematic front view of the subsea power line modem.

In FIG. 3, a schematic front view of the modem 1 of FIG. 2 is depicted. The electronic components are mounted on both sides of the six-layer printed circuit board 2 that has a size e.g. of 100 mm×160 mm and exceeds the cross section of the encapsulation 5. Only two D-SUB ports 19 and 20 are arranged outside of the encapsulation 5. They externally provide the RS-485 connection and the RS-232 connection (not shown in this figure).

The encapsulation 5 consists of water-jet cut aluminum, comprising five parts: A one-piece front frame 5.1, a front cover (not shown), a one-piece back frame 5.2 (in this figure hidden behind the printed circuit board 2—see FIG. 4), a back cover (not shown) and a one-piece body 5.3. All of the said parts are provided with bores 22 to fixate them against the printed circuit board 2 by screws. The front frame 5.1 exhibits intermediate walls 6 that subdivide the interior of the front frame 5.1 into three separate chambers 7, 8 and 21. The first chamber 7 surrounds analogue send components, such as the power amplifier 4, and receive components, such as the low-noise amplifier 13. The second chamber 8 surrounds the analogue-to-digital converter 12 and the digital-to-analogue converter 14 as well as a low-noise amplifier 13. The third chamber 21 surrounds the digital signal processor 3, the field programmable gate array 9 and a DC/DC power supply 23. The metal body 5.3 surrounds only the power amplifier 4 within the first chamber 7.

The front frame 5.1, the back frame 5.2 and the covers have a least thickness of 2 mm. The front frame 5.1 has e.g. a height of 20 mm. The back frame 5.2 has e.g. a height of 5 mm. The front frame 5.1 is mounted by screws that are fastened thoroughly through the bores 22 of back cover, back frame 5.2, printed circuit board 2, and into the front frame 5.1. Hence, both frames 5.1, 5.2 are entirely in tight contact with the printed circuit board 2. The front cover is mounted directly onto the front frame 5.1 by screws through the bores 22 of the front cover into the front frame 5.1. A heat conductive pad should be mounted exactly where the metal body 5.3 reaches the front cover. The metal body 5.3 is mounted around the power amplifier by screws through the printed circuit board 2 and into the metal body 5.3. The printed circuit board 2 is provided with metal contact zones in areas where the separating walls 6 touch it. The aluminum parts of the encapsulation 5 can be simply produced with the print card design of the printed circuit board 2.

On the back side of the printed circuit board 2, as shown in FIG. 4, the back frame 5.2 is a mirrored counterpart to the front frame 5.1. Thus, the three chambers 7, 8, 21 are continued to the back side of the printed circuit board 2. If the back and front covers are mounted, the encapsulation 5 comprising the chambers 7, 8, 21 and the metal body 5.3 act as an efficient Faraday cage as described above.

What is claimed is:

1. A modem comprising:
   electronic components on a circuit board having a first side and an opposite second side, and
   a metal encapsulation including:
      a one-piece front frame arranged on the first side of the circuit board, the one-piece front frame including an outer perimeter wall and one or move internal walls within the outer perimeter,
      a front cover distinct from and removably secured to the front frame,
      a one-piece back frame arranged on the second side of the circuit board, the one-piece back frame including an outer perimeter wall and one or move internal walls within the outer perimeter, and
      a back cover distinct from and removably secured to the back frame,
      wherein the outer perimeter walls and the internal walls of the one-piece front frame and the one-piece back frame define at least three chambers, including:
         a first chamber that surrounds analogue send and receive components, including a power amplifier arranged on the first side of the circuit board,
         a second chamber that surrounds analogue-to-digital and digital-to-analogue components, and
         a third chamber that surrounds a high-frequency digital signal processor, a field programmable gate array, and a DC/DC power supply, and
      a metal body surrounding, but not contacting, the power amplifier component arranged on the first side of the circuit board, the metal body being distinct from the metal encapsulation and arranged within the first chamber defined by the metal encapsulation.

2. The modem according to claim 1, wherein said chambers are arranged at a first side of said circuit board.

3. The modem according to claim 2, wherein for at least one particular chamber, a corresponding mirrored chamber is implemented on an opposite side of said circuit board.

4. The modem according to claim 3, wherein the circuit board separates said each of said at least one particular chamber from its corresponding mirrored chamber.

5. The modem according to claim 1, wherein the at least one separating wall is in tight contact with said circuit board.

6. The modem according to claim 5, wherein the circuit board is provided at its surface with at least one metal contact zone for the at least one separating wall.

7. The modem according to claim 1, wherein one plane side of each of said frames is entirely in tight contact with said circuit board.

8. The modem according to claim 1, wherein the encapsulation consists of aluminum.

9. The modem according to claim 1, wherein the encapsulation has a least thickness of 2 mm.

10. The modem according to claim 1, wherein the modem is a subsea power line communication modem.

11. A method for subsea power line communication, comprising the steps of:
   providing a modem with electronic components on a circuit board having a first side and an opposite second side, and
   providing a metal encapsulation including:
      a one-piece front frame arranged on the first side of the circuit board, the one-piece front frame including an outer perimeter wall and one or move internal walls within the outer perimeter,
      a front cover distinct from and removably secured to the front frame,
      a one-piece back frame arranged on the second side of the circuit board, the one-piece back frame including an outer perimeter wall and one or move internal walls within the outer perimeter, and
      a back cover distinct from and removably secured to the back frame,
      such that the outer perimeter walls and the internal walls of the one-piece front frame and the one-piece back frame define at least three chambers, including:

a first chamber that surrounds analogue send and receive components including a power amplifier arranged on the first side of the circuit board, a second chamber that surrounds analogue-to-digital and digital-to-analogue components, and a third chamber that surrounds a high-frequency digital signal processor, a field programmable gate array, and a DC/DC power supply, and providing a metal body surrounding, but not contacting, the power amplifier component arranged on the first side of the circuit board, the metal body being distinct from the one-piece front frame and arranged within the first chamber.

12. The method according to claim 11, comprising the step of arranging said chambers at a first side of said circuit board.

13. The method according to claim 12, wherein for at least one particular chamber, a corresponding mirrored chamber is implemented on an opposite side of said circuit board.

14. The method according to claim 13, wherein the circuit board separates said each of said at least one particular chamber from its corresponding mirrored chamber.

15. The method according to claim 11, wherein the at least one separating wall is in tight contact with said circuit board.

16. The method according to claim 15, comprising the step of providing the circuit board at its surface with at least one metal contact zone the at least one separating wall.

* * * * *